(12) United States Patent
Honda

(10) Patent No.: US 7,394,315 B2
(45) Date of Patent: Jul. 1, 2008

(54) GATE DRIVER FOR CLASS D AUDIO AMPLIFIER WITH ADAPTIVE DV/DT CONTROL

(75) Inventor: Jun Honda, El Sequndo, CA (US)

(73) Assignee: International Rectifier Corporation, El Segundo, CA (US)

(*) Notice: Subject to any disclaimer, the term of this patent is extended or adjusted under 35 U.S.C. 154(b) by 134 days.

(21) Appl. No.: 11/396,760

(22) Filed: Apr. 3, 2006

(65) Prior Publication Data

US 2006/0220735 A1    Oct. 5, 2006

Related U.S. Application Data

(60) Provisional application No. 60/668,656, filed on Apr. 5, 2005.

(51) Int. Cl.
*H03F 3/217* (2006.01)
(52) U.S. Cl. .................. 330/251; 330/207 A
(58) Field of Classification Search .......... 330/10, 330/207 A, 251
See application file for complete search history.

(56) References Cited

U.S. PATENT DOCUMENTS

| 7,061,195 B2 * | 6/2006 | Ho et al. ............ 318/438 |
|---|---|---|
| 2004/0130923 A1 | 7/2004 | Ho et al. ............ 363/131 |

OTHER PUBLICATIONS

International Search Report in corresponding International Application No. PCT/US06/12201 mailed Oct. 18, 2007.

* cited by examiner

*Primary Examiner*—Steven J. Mottola
(74) *Attorney, Agent, or Firm*—Ostrolenk, Faber, Gerb & Soffen, LLP

(57) ABSTRACT

Provided is a gate driver circuit for a Class D audio amplifier with adaptive dV/dt control. The circuit includes an output switching stage, a gate driver capable of driving the output switching stage with a variable dV/dt; and a mode control circuit for setting an operating mode of the gate driver, wherein, the operating mode is selected from a plurality of operating modes, changes the dV/dt of the gate driver, corresponds to a power output level, and provides a balance point between a generated Electromagnetic Interference (EMI) and an efficiency of the switching stage.

9 Claims, 4 Drawing Sheets

GATE DRIVER FOR CLASS D AUDIO AMPLIFIER WITH ADAPTIVE DV/DT CONTROL

CROSS-REFERENCE TO RELATED APPLICATION

This application is based on and claims benefit of U.S. Provisional Application Ser. No. 60/668,656, filed on Apr. 5, 2005, entitled GATE DRIVER FOR CLASS D AUDIO AMPLIFIER WITH ADAPTIVE dV/dt CONTROL, to which a claim of priority is hereby made and the disclosure of which is incorporated by reference.

FIELD OF THE INVENTION

The present invention relates to Class D amplifiers, and more particularly, to using adaptive dV/dt control on the Class D amplifiers.

BACKGROUND OF THE INVENTION

Power efficient class D amplifiers, e.g., amplifier 10 shown in FIG. 1, convert an input waveform into a continuously pulse-width modulated (PWM) analog signal. Signals with a bandwidth well below the pulse frequency may be reproduced. The output of a Class D amplifier contains unwanted spectral components, i.e., the pulse frequency and its harmonics, that must be removed by a passive LC filter 18. The resulting filtered signal is then an amplified replica of the input.

Generally, as shown in FIG. 1, a switching stage 12 of power transistors 14, 16 entails a trade off between efficiency and Electromagnetic Interference (EMI) emitted as a by-product of its normal operation. EMI causes unwanted signals (interference or noise) to be induced in the circuits. Higher dV/dt is required for the switching stage 12 to gain better efficiency. However, because of its steep transient artifacts, higher voltage change over time (dV/dt) can be a cause of EMI noise.

It is in the nature of an audio signal in a class D audio application, that the average output power is significantly smaller than its peak value. If an amplifier has a low EMI noise emission at a lower output power level and higher efficiency at a higher output power level then these two contrary design issues can be compatible.

SUMMARY OF THE INVENTION

Thus, it is an object of the present invention to allow changing gate drivability to control dV/dt at the switching node in accordance with an input duty cycle.

The present invention provides a gate driver circuit for a Class D audio amplifier with adaptive dV/dt control. The circuit includes an output switching stage, a gate driver capable of driving the output switching stage with a variable dV/dt; and a mode control circuit for setting an operating mode of the gate driver, wherein, the operating mode is selected from a plurality of operating modes, changes the dV/dt of the gate driver, corresponds to a power output level, and provides a balance point between a generated Electromagnetic Interference (EMI) and an efficiency of the switching stage.

In one embodiment of the invention the gate driver has two operational modes. One is for high dV/dt and the other is for a lower dV/dt to reduce EMI in a compromise causing degradation of efficiency. The gate driver changes its mode according to the estimated output power level. The gate driver estimates the average of the output power to the load by calculating a power from the input duty cycle.

Other features and advantages of the present invention will become apparent from the following description of the invention that refers to the accompanying drawings.

DETAILED DESCRIPTION OF EMBODIMENTS OF THE INVENTION

Figure 1:
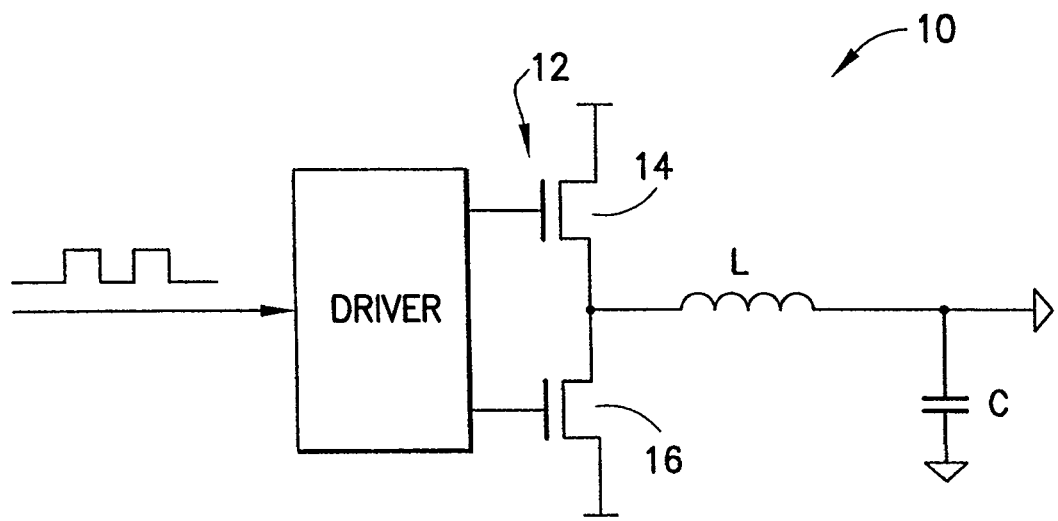
FIG. 1 is a circuit diagram of a class D amplifier having a half bridge topology.
Figure 2A:
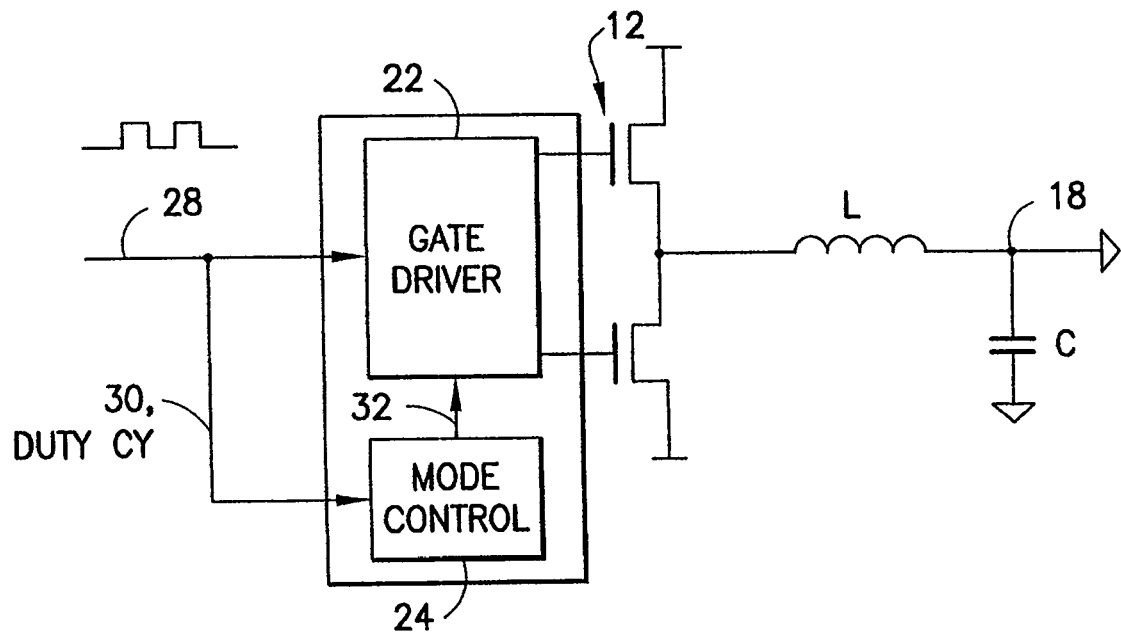
FIGS. 2A, 2B, and 2C are circuit diagrams of a class D amplifier showing various embodiments of mode control of the present invention.
Figure 2B:
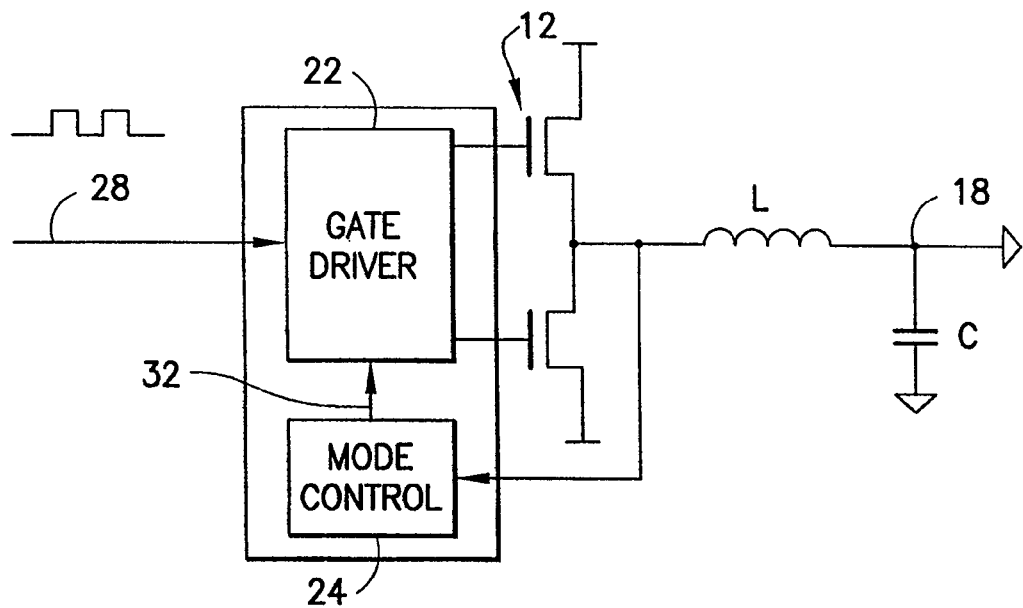
Figure 2C:
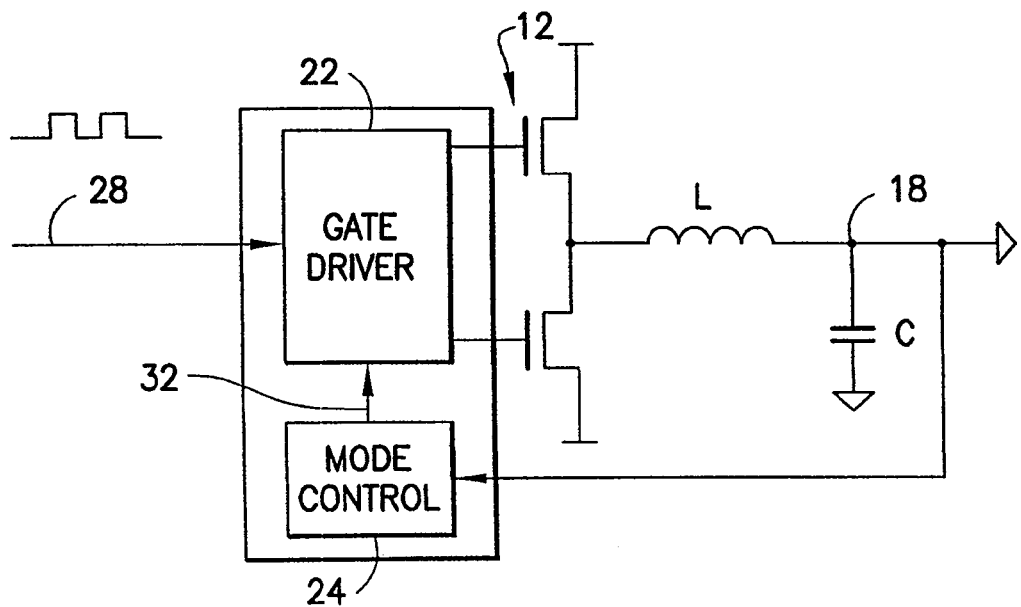

FIGS. 2A, 2B, and 2C show a gate driver 22 of the present invention. The gate driver 22 includes two different operational modes. The first mode is for a high voltage change over time (dV/dt) and the second is for the lower dV/dt to reduce the Electromagnetic Interference (EMI) with degradation in efficiency as a compromise. The gate driver 22 is designed to change its mode in accordance with an estimated or calculated output power level.

Estimating Output Power

The inventive gate driver 22 of FIG. 2A, includes mode control circuitry 24 that enables execution of a function for estimating an average output power level 32 to the load by calculating a power from a duty cycle 30 of input 28. The average output power level 32 can be obtained by integrating a square of the input duty cycle, i.e., $(0.5\text{-duty cycle})^2$, which expresses the output power level into the resistive load (not shown). If the average output power level 32 exceeds a certain predetermined level, then the gate driver 22 changes the mode from low dV/dt to high dV/dt.

Appropriate threshold of the averaged output power level may be set above 12.5% of a rated power level so that the gate driver is allowed to operate under a low dV/dt mode most of the time. 12.5% of rated power can be considered to be a maximum average output power with non clipping audio signal output. Clipping happens when an attempt is made to increase voltage above the amplifier's limits The most severe EMI condition of class D stage in terms of loss and heat generation is at rated power level. The gate driver 22 operates in high efficiency high dV/dt mode in those conditions under compromise with EMI noise. This, however, is very rare in practical usage.

Calculating Output Power

Similarly, circuitry 24 may calculate an average output power level 32 to the load by calculating the power from any of voltage, current, and volt-sec. at the output of the switching stage 12, before the LC filter 18 as shown in FIG. 2B or after the LC filter as shown in FIG. 2C.

Figure 3:
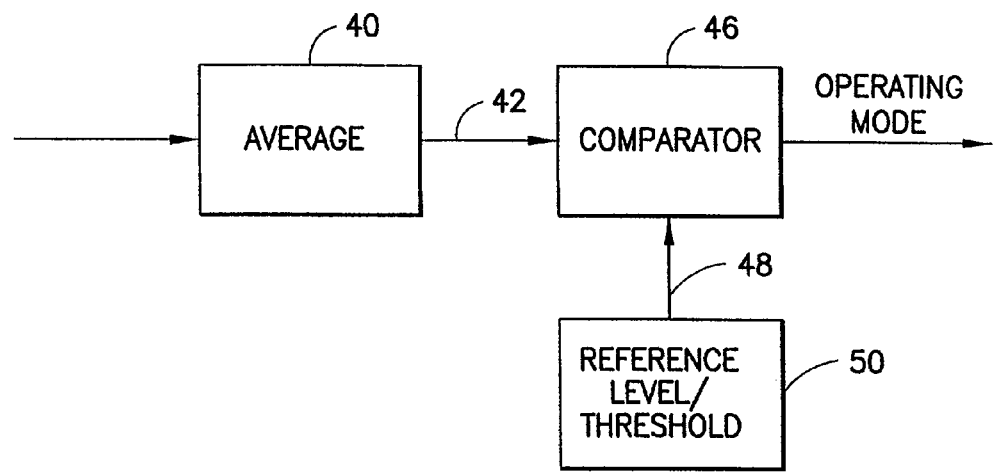
FIG. 3 is a block diagram of a mode control logic of the class D amplifier of the present invention.

FIG. 3 shows a block diagram of the mode controller circuit 24. An average calculating unit 40 receives the PWM input 28, detects the duty cycle 30 over some sufficiently long period of time for the average. The average 42 is passed to the comparator part 46 that compares the average 42 with the predetermined level 48 maintained in the reference level holding block 50. If the average 42 is higher than the predetermined level 48, the mode is set to HIGH, else it is set to LOW.

Figure 4A:
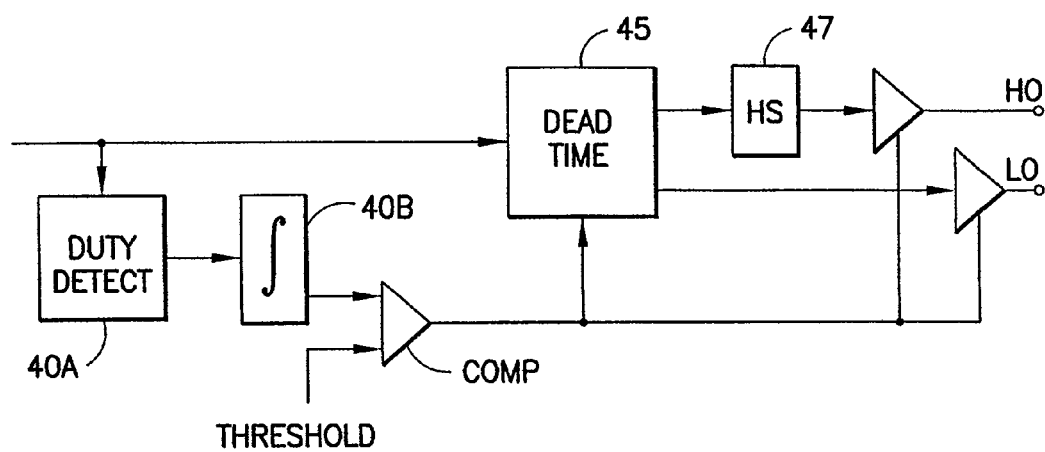
FIG. 4A shows an embodiment of a gate driver including the mode control logic of the present invention and corresponding FIGS. 4B-4D showing duty detect, THD and dead time graphs.

In the circuit of FIG. 4A, the output power is estimated by circuit 40A, for example, using the formula power=|duty angle−0.5|$^2$. An integrater stop 40B is used to determine the average time. The average is compared in a comparator 46 to a threshold. If below the threshold, the drivers Ho and Lo are maintained in the low dV/dt, lower efficiency mode. If above the threshold, the drivers Ho and Lo are placed in the high efficiency, high dV/dt mode.

Figure 4B:
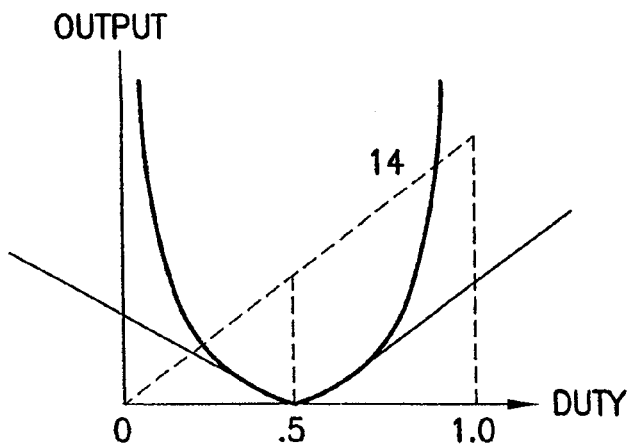
Figure 4C:
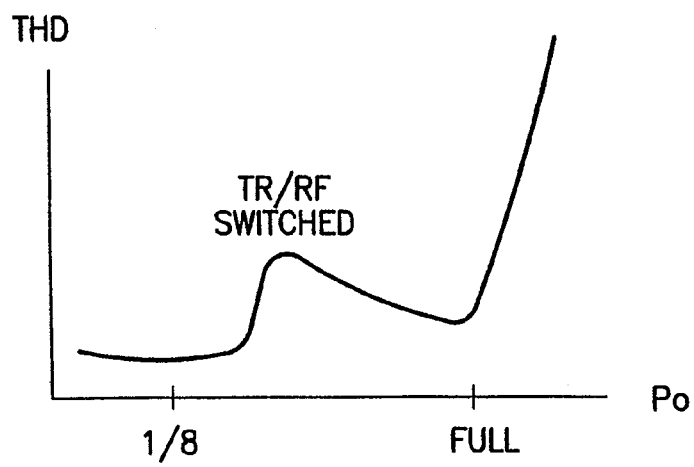
Figure 4D:
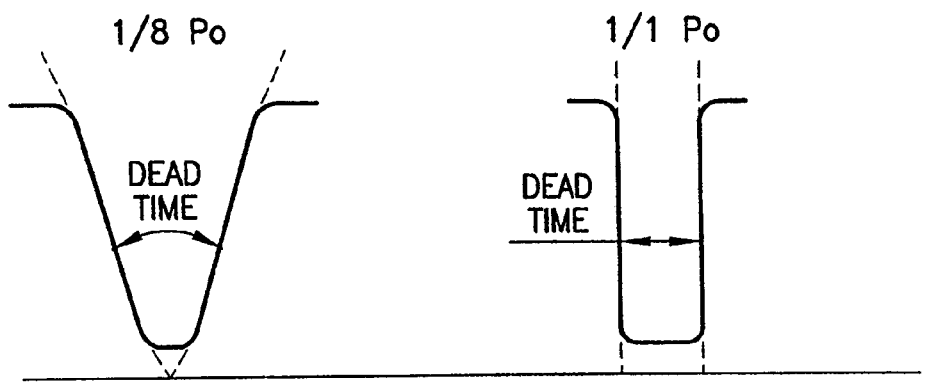

Also, a dead time circuit 45 adjusts the dead time in accordance with the comparator 46 output. This is done so that at high power the dead time is set to a greater value as shown in FIG. 4D. FIG. 4B shows the duty detect circuit function and FIG. 4C shows a total harmonic distortion (THD) as a function of power.

The circuitry of the invention provides for shorter, variable dead time, low Full and low THD at low power levels, but greater efficiency at high power levels.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A gate driver circuit for a Class D audio amplifier with adaptive dV/dt control, the circuit comprising:
   an output switching stage;
   a gate driver capable of driving the output switching stage with a variable dV/dt; and
   a mode control circuit for setting an operating mode of the gate driver,
   wherein the operating mode
      is selected from a plurality of operating modes,
      changes the dV/dt of the gate driver,
      corresponds to a power output level, and
      provides a balance point between a generated Electromagnetic Interference (EMI) and
      an efficiency of the switching stage, and
   wherein the plurality of operating modes are determined by estimating an average output power level from an input into the gate driver.

2. A gate driver circuit for a Class D audio amplifier with adaptive dV/dt control, the circuit comprising:
   an output switching stage;
   a gate driver capable of driving the output switching stage with a variable dV/dt; and
   a mode control circuit for setting an operating mode of the gate driver,
   wherein the operating mode
      is selected from a plurality of operating modes,
      changes the dV/dt of the gate driver,
      corresponds to a power output level, and
      provides a balance point between a generated Electromagnetic Interference (EMI) and
      an efficiency of the switching stage, and
   wherein the plurality of operating modes are determined by calculating an output power level from one of an output voltage, an output current, a volt-second of a pulse width modulation (PWM) signal at a point between the switching stage and a filter or at a point between the filter and a load.

3. The circuit of claim 1, wherein the mode control circuit estimates the average output power level by detecting a duty cycle of a pulse width modulation (PWM) at the input and obtaining an average output power level by integrating a square of an input duty cycle, the square of the input duty cycle expressing the output power level into a load.

4. The circuit of claim 3, wherein the power output level of the gate driver is switched from a low dV/dt to a high dV/dt if the average output power level exceeds a predetermined threshold.

5. The circuit of claim 3, wherein the predetermined threshold is set above 12.5% of a rated power level, wherein the gate driver operates under the low dV/dt and the 12.5% of the rated power is considered a maximum average output power.

6. The circuit of claim 1, wherein different settings for driving the gates are derived by changing at least one of an output impedance, an output voltage of the gate driver, and coupling a current limiter to an output of the gate driver.

7. A gate driver circuit for a Class D audio amplifier with adaptive dV/dt control, the circuit comprising:
   an output switching stage having two series connected switches;
   a gate driver capable of driving the output switching stage with a variable dV/dt; and
   a mode control circuit for setting an operating mode of the gate driver,
   wherein the operating mode
      is selected from a plurality of operating modes,
      changes the dV/dt of the gate driver,
      corresponds to a power output level, and
      provides a balance point between a generated Electromagnetic Interference (EMI) and
      an efficiency of the switching stage, and
   wherein the mode control circuit controls the dead time between on time of the two series connected switches of the switch stage.

8. The circuit of claim 1, wherein the switch stage includes two series connected switches.

9. A method of operating a gate driver circuit for a Class D audio amplifier using adaptive dV/dt control, the method comprising the step of:
   determining a power output level of a gate driver capable of driving an output switching stage with a variable dV/dt;
   switching the power output level of the gate driver from a low dV/dt to a high dV/dt if an average of the output power level exceeds a predetermined threshold;
   selecting an operating mode corresponding to the power output level for providing a balance point between a generated Electromagnetic Interference (EMI) and an efficiency of the switching stage; and
   setting the operating mode and therefore the dV/dt of the gate driver.

* * * * *